United States Patent [19]

Whiteley et al.

[11] Patent Number: 4,789,794
[45] Date of Patent: Dec. 6, 1988

[54] TIME DOMAIN REFLECTOMETER

[75] Inventors: Stephen R. Whiteley, Shrub Oak; Sadeg M. Faris, Yorktown Heights, both of N.Y.

[73] Assignee: Hypres Incorporated, Elmsford, N.Y.

[21] Appl. No.: 912,785

[22] Filed: Sep. 26, 1986

[51] Int. Cl.$^4$ .................. H03K 5/135; H03K 17/92; H03K 19/195
[52] U.S. Cl. .................... 307/352; 307/277; 307/306; 307/476; 357/5
[58] Field of Search ............. 307/352, 277, 306, 462, 307/476; 357/5; 365/162

[56] References Cited

U.S. PATENT DOCUMENTS

| | | | |
|---|---|---|---|
| 4,245,169 | 1/1981 | Hamilton | 307/306 |
| 4,401,900 | 8/1983 | Faris | 307/352 |
| 4,533,840 | 8/1985 | Gheewala et al. | 307/352 |
| 4,638,185 | 1/1987 | Kobayashi et al. | 307/352 |

OTHER PUBLICATIONS

P. Wolf, "Picosecond Sampling with Josephson Junctions", Picosecond Electronics and Optoelectronics (ed. Mourou, et al.) pp. 236-243, 1985.
C. A. Hamilton, et al., "Analog Measurement Applications for High Speed Josephson Switches", I.E.E.E. Transactions on Magnetics, vol. MAG-17, No. 1, Jan. 1981.
P. Wolf, et al., "A Josephson Sampler with 2.1 ps Resolution", I.E.E.E. Transactions on Magnetics, vol. MAG-21, No. 2, Mar. 1985.
J. Matisoo, "Overview of Josephson Technology Logic and Memory", I.B.M. J. of Research and Development, vol. 24, No. 2, pp. 113-120 3/80.
S. Faris, "VLSI Superconducting Technologies", Chapter 9 of Hardware and Software Concepts in VLSI, pp. 177-238, 1983.
H. H. Zappe, "Josephson Computer Technology", Advances in Superconductivity (ed. Deaver, et al.), pp. 51-127, 1983.
Tektronix' TEK 7000 Series Modular Oscilloscopes Technique Primer 42W-5969, "Sampling Techniques Primer", 1985.
Tektronix' TEK Products 1987, product catalogue cover and inside first page, pp. 254 and 256, and sales/service office page.

Primary Examiner—John Zazworsky
Attorney, Agent, or Firm—Kenyon & Kenyon

[57] ABSTRACT

A circuit is provided for sampling and accurately reproducing unknown signals, which could be electrical, optical, X-ray, gamma ray or particle signals, with picosecond resolution. The circuit comprises a superconductive sampling gate having at least two states which are distinguishable from one another and switching circuitry to switch the state of the sampling gate. The switching circuitry includes a sampling pulse source and a bias current source which are combined with the unknown signal to change the state of the monitor gate. A step generator utilizing Josephson junction technology is connected to the source of the unknown signal and sends a signal to the source of the unknown signal in order to initiate the outputting of the unknown signal and thus the sampling. Timing circuitry, also utilizing Josephson junction technology, provides an adjustable delay between the step signal generation and the sampling pulse generation.

35 Claims, 9 Drawing Sheets

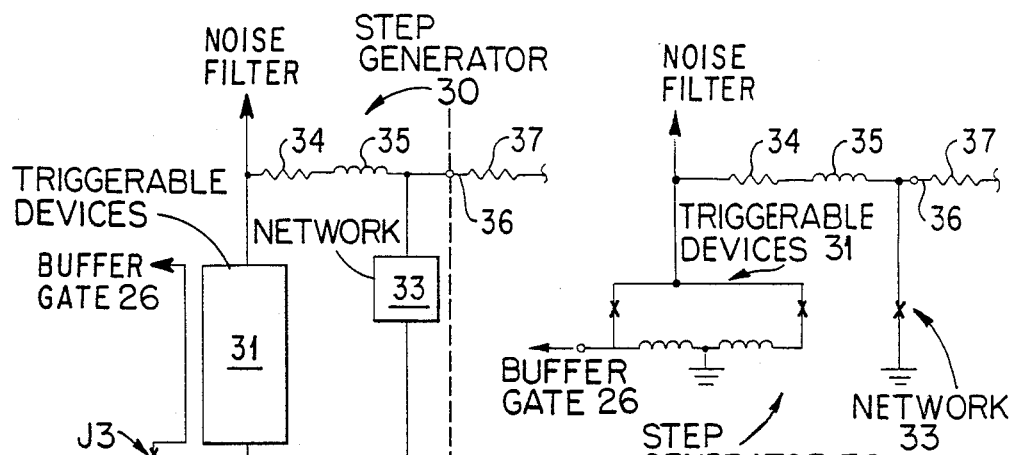
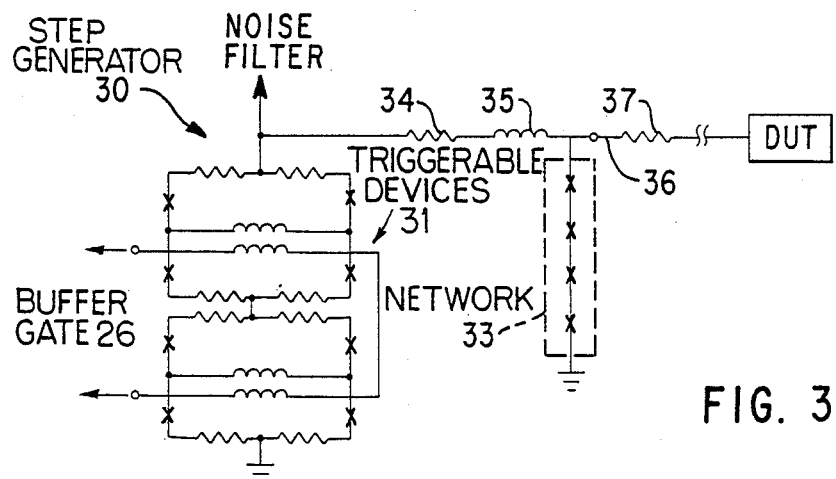
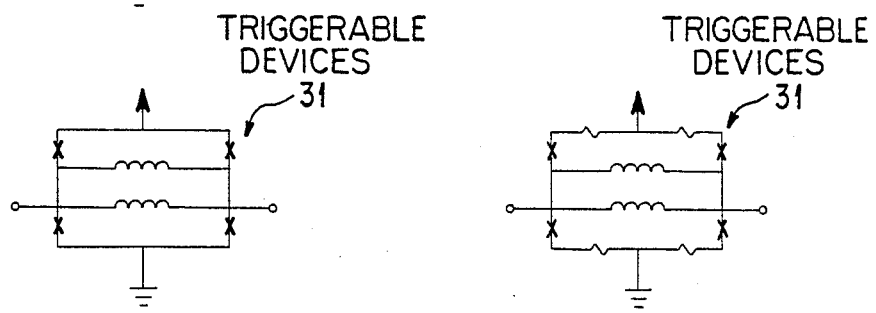
FIG. 3a  FIG. 3b  FIG. 3c  FIG. 3d  FIG. 3e

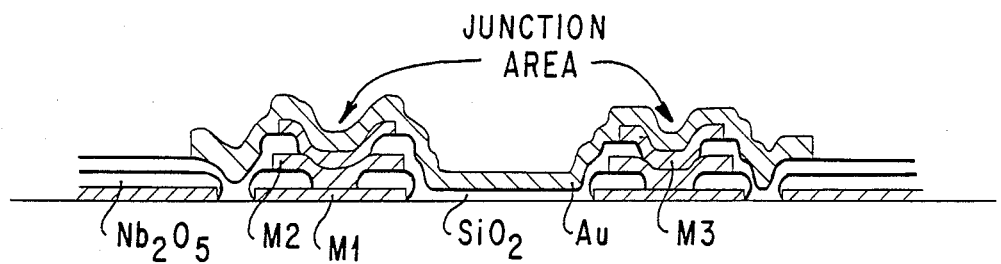
VERTICAL PROFILE A
FIG. 5a(1)
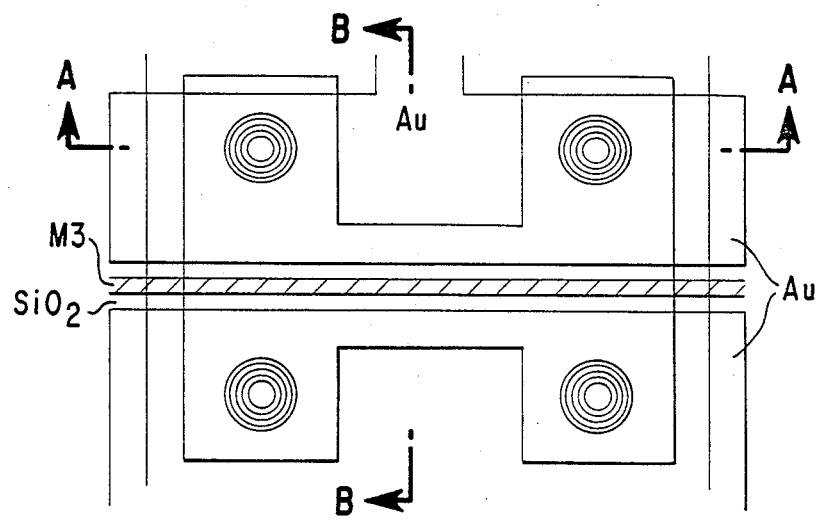
TOP VIEW
FIG. 5a(2)
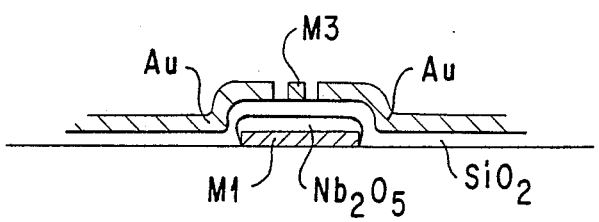
VERTICAL PROFILE B
FIG. 5a(3)

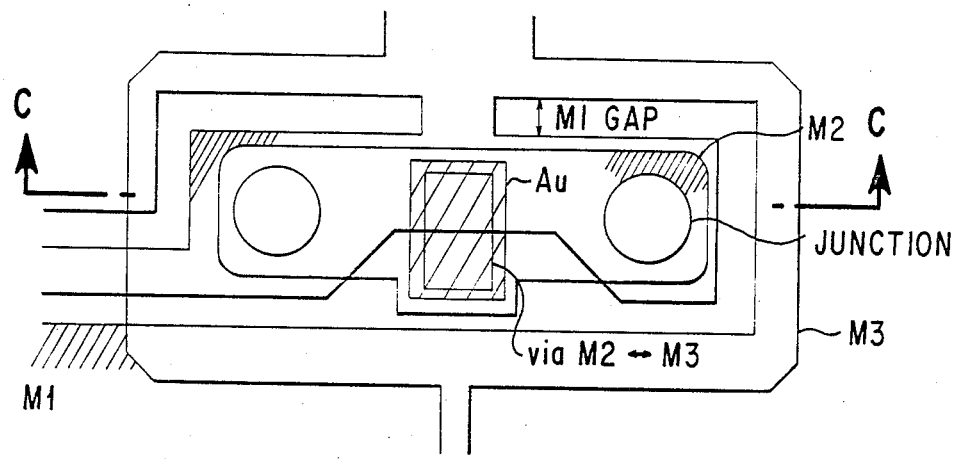
TOP VIEW
FIG. 5b(1)
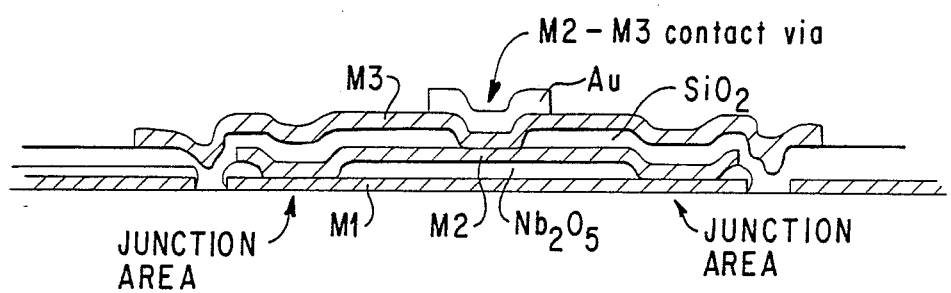
VERTICAL PROFILE C
FIG. 5b(2)

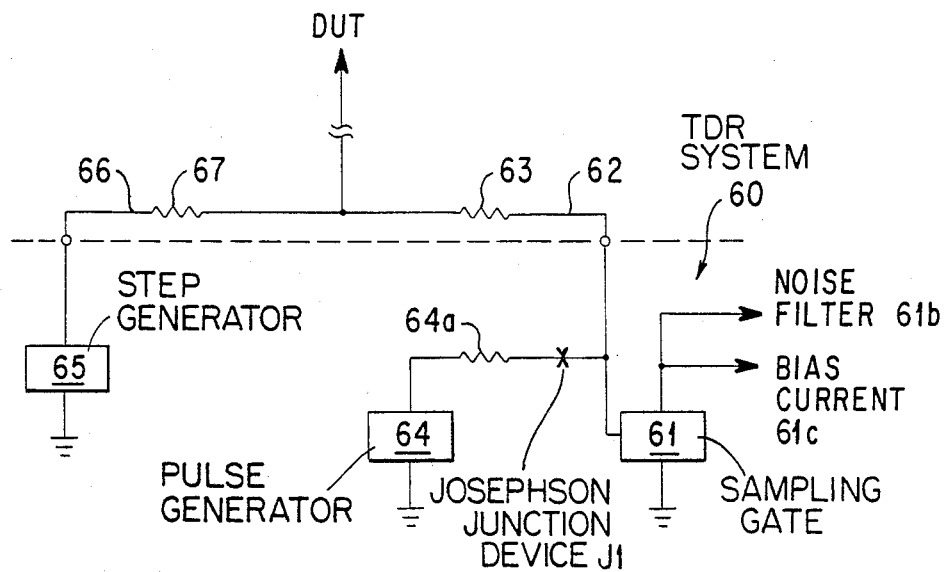
FIG. 6a
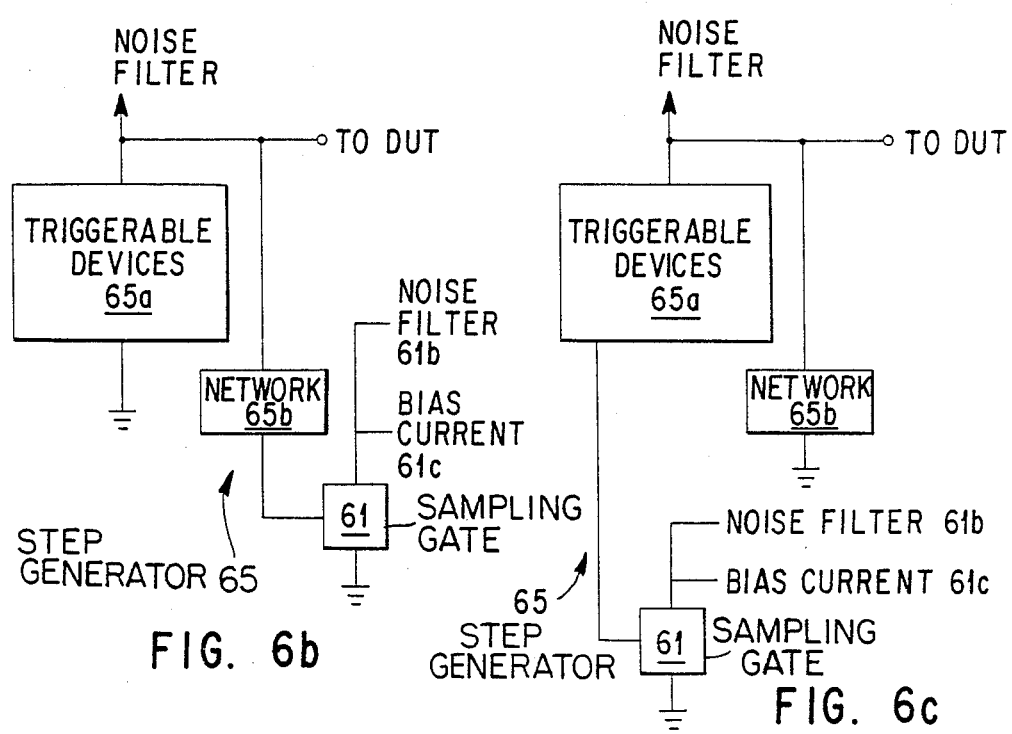
FIG. 6b
FIG. 6c

TIME DOMAIN REFLECTOMETER

TECHNICAL FIELD

The invention relates generally to apparatus and method for ultra-high resolution sampling of rapidly changing waveforms of output signals generated by a signal source. In particular, the inventino relates to a time domain reflectometer system which utilizes Josephson junction technology.

BACKGROUND OF THE INVENTION

The use of superconducting devices, and particularly Josephson tunnelling devices, in sampling or A/D circuits is already known in the art. Use of a Josephson device provide a very sensitive detector offering the possibility of very fast sampling speeds because such a device is capable of extremely fast switching speed between two stable states and because the device responds to extremely small magnetic fields. U.S. Pat. No. 4,401,900 shows a Josephson sampling technique with a time resolution of 5 picoseconds and a sensitivity of 10 microvolts. The time resolution of the described sampling system is extendable to the sub-picosecond domain, limited ultimately by the intrinsic switching speed of the Josephson device used as the sampling gate. In principle, the switching speed can be as fast as 0.09 picoseconds. Josephson sampling techniques are not restricted to only those waveforms produced in a cryogenic environment. Rather, they can be used to measure waveforms from various sources, such as x-rays, optical photons or electrical waveforms produced by room-temperature sources, if a suitable interface is available. Examples of such interfaces are described in the copending patent applications Ser. No. 796,841, entitled "Room Temperature to Cryogenic Electrical Interface" filed on Nov. 12, 1985 and Ser. No. 796,842, entitled "Open Cycle Cooling of Electrical Circuits" filed on Nov. 12, 1985.

The Josephson sampling system described in U.S. Pat. No. 4,401,900 comprises a superconductive monitor gate, such as a single Josephson device, which has at least two states distinguishable from one another and which is sensitive to the unknown waveform or signal to be sampled. Switching means, which includes the source of the unknown signal, a source of timing pulses, and a source of a bias signal, changes the state of the monitor gate by a proper combination of the above signals. A timing means is provided to establish both a timing reference and an accurate sampling delay time. The timing means includes a pulse generator for providing very short sampling pulses, delay lines, and a source of trigger pulses. The sampling system also has noise elimination means to ensure the accuracy of the sample at any given instant of time and a display to indicate the unknown waveform.

Sampling systems, however, are inadequate to accurately measure discontinuities of network connections and to determine parameters of certain networks and devices. In such applications, time domain reflectometers, which comprise sampling circuitry with a step or pulse source, are needed. Such a device usually supplies a pulse of a very short duration or a step with a very short rise time. The shorter the rise time, the higher the time accuracy and the finer the details which can be measured by the sampling circuitry. The only time domain reflectometer system (TDR system) that is known to the applicants as being available commercially is manufactured by Tektronix, Inc. of Beaverton, Oreg. as a plug-in module to its 7000 series oscilloscope. The TDR system consists of the sampling system plus a separate pulse generator and has a system rise time of more than 40 picoseconds.

One problem of existing TDR systems, such as the one described above, is the relatively long system rise time which is inadequate for displaying rapidly changing waveforms. A second problem is that existing TDR systems have the sampling circuitry separate from the pulse generator. Thus, if an existing superconducting sampling system is utilized to overcome the rise time problem, the pulse generator of the TDR system would be separate from, and only bonded to, the integrated circuit chip upon which the sampling circuitry is formed. Such a bond, however, has been shown to have a reliability risk, as well as performance limitations. Further, it has been shown by the aforementioned copending applications that the thermal, mechanical and electrical constraints that must be satisfied in order to perform superconducting sampling of room-temperature devices can be obviated by a monolithic chip having all the particular circuitry and high performance transmission lines formed theron.

SUMMARY OF THE INVENTION

The foregoing problems are obviated by the invention, comprising:
(a) means for generating and transmitting a trigger signal to the signal source to initiate a transmission of the output signal to the sampling system;
(b) means for generating and introducing sampling pulses with the transmission of the output signal to the sampling system;
(c) means for sampling the output signal comprising an adjustable bias signal source and a superconducting sampling gate having at least two distinguishable states to which the output signal, said sampling pulses and a bias signal provided by said adjustable bias signal source is applied for switching the state of said gate in sampling the output signal; and
(d) means for providing an adjustable time delay in the application of said sampling pulses with respect to the application of said trigger signal.

Advantageously, the use of superconducting sampling, employing, in particular, Josephson junction technology, in a TDR system increases the switching speed of such a system and obtains a system rise time of less than 10 picoseconds. In addition, the invention integrates on a single integrated circuit chip, a step generator, sampling circuitry, filter elements and ultra-high performance transmission lines. Such a chip is optimized with respect to satisfying electrical, thermal and mechanical constraints imposed by the extremely low operating temperatures at which Josephson junction circuitry must function. Such a chip also achieves minimum jitter during the operation of the TDR system since all the circuitry formed thereon, which already has reduced jitter as a result of utilizing Josephson junction technology, is subject to the same random disturbances which may occur. Further, the invention provides for a novel step generator and novel delay mechanism which take advantage of Josephson junction technology.

BRIEF DESCRIPTION OF THE DRAWINGS

For a better understanding of the invention, reference is made to the following description of an exemplary embodiment thereof, and to the accompanying drawings, wherein:

FIGS. 3a–3e are electrical schematic diagrams of several embodiments of a step generator of the TDR system of FIG. 2;

FIG. 5a is a schematic representation of the vertical profile of the structure of the step generator of FIGS. 3a–3e;

FIG. 5b is a schematic representation of the vertical profile of the structure of the pulse generator gate and the buffer gate of FIG. 4a; and FIGS. 6a–6c are electrical schematic diagrams of several embodiments of a TDR system of the present invention utilizing direct coupling.

DETAILED DESCRIPTION

Figure 1:
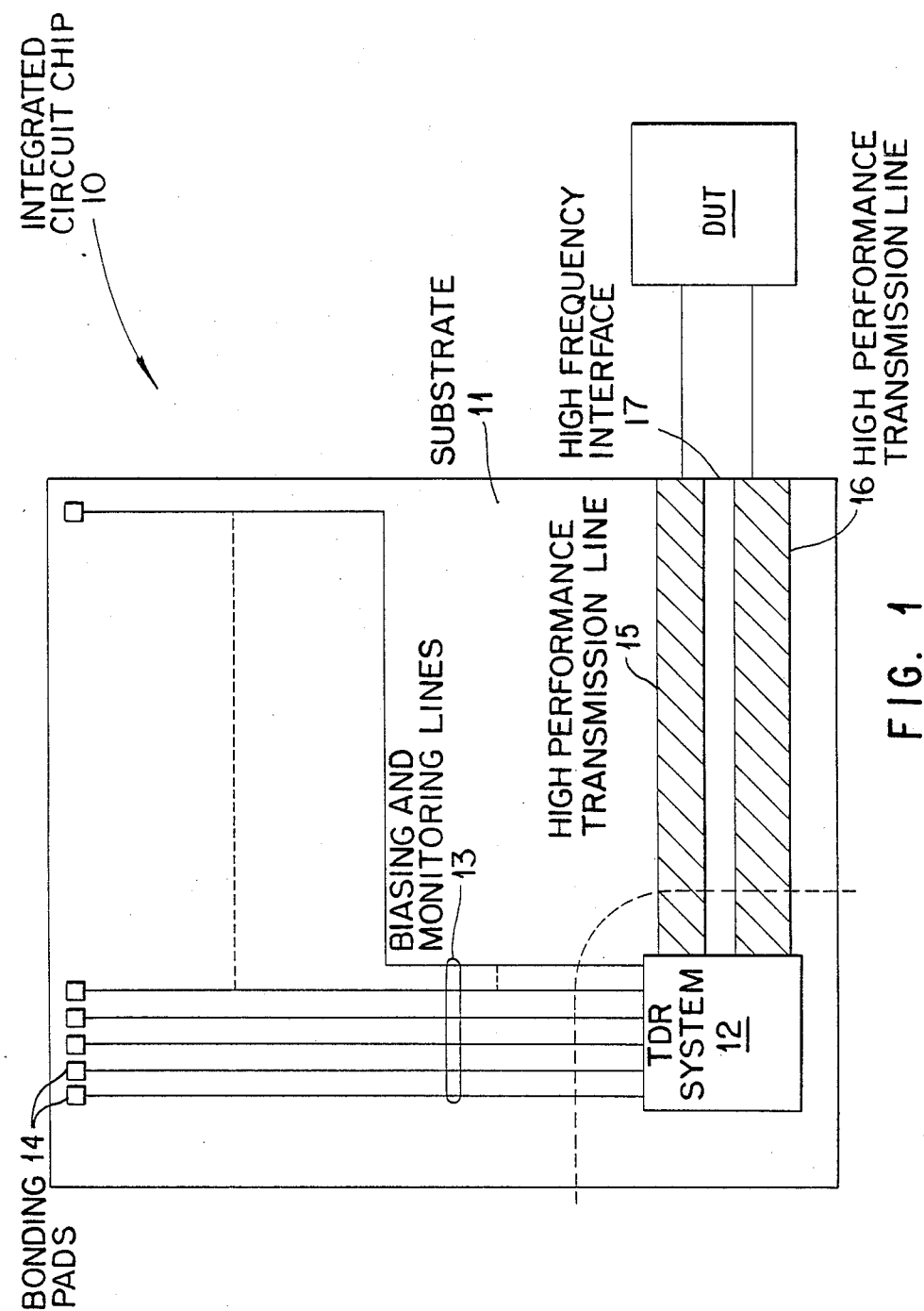
FIG. 1 is a schematic representation of the layout/architecture of an integrated circuit chip having formed thereon a TDR system of the present invention.

FIG. 1 shows the layout/architecture of an integrated circuit chip 10 that has formed thereon a TDR system of the present invention. The chip 10 comprises an elongated substrate 11 whose material and physical dimensions are dependent upon the particular application. Fabricated at one corner of the substrate 11 by a known method is a time domain reflectometer system (TDR system) 12 which utilizes Josephson junction circuitry. The area of the substrate 11 on which the TDR system 12 lies, as indicated by the dashed line in FIG. 1, is cooled to cryogenic temperatures, for example, according to the apparatus and method of the copending application Ser. Nos. 796,841 or 796,842; the remaining substrate 11 area is at room temperature. A number of non-critical biasing and monitoring lines 13, which may be of niobium or gold, connect to the TDR system 12 and extend most of the length of the substrate 11 to a group of connection or bonding pads 14 which act as the low frequency interface for bonding to room temperature circuitry off the chip 10. High performance transmission lines 15, 16, which also may be of niobium or gold, extend from the TDR system 12 to a high frequency interface 17 at the other end of the substrate 11 which connects to a device under test (DUT) whose waveforms are to be sampled and measured. The physical constraints that the high performance transmission lines 15, 16 must satisfy in order to maintain the necessary performance for sampling and measuring are described in the co-pending application Ser. No. 796,841.

Figure 2:
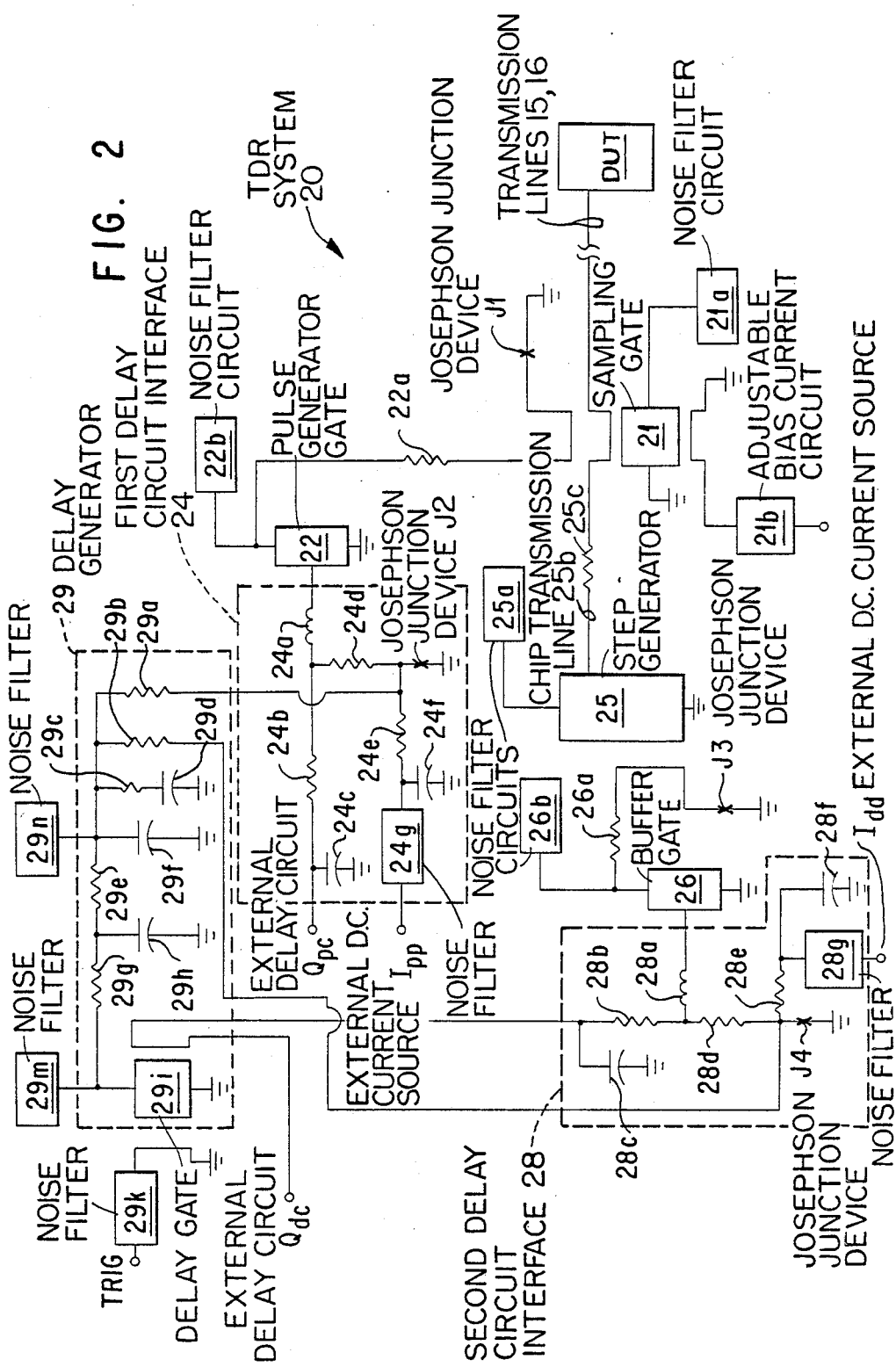
FIG. 2 is an electrical schematic diagram of a TDR system of the present invention.

FIG. 2 is an electrical schematic diagram of a TDR system 20 of the present invention connected to a device under test (DUT) whose output signal waveform, $I_x(t)$ is to be sampled and measured. The TDR system 20 comprises a sampling gate 21 which has connected thereto a noise filter circuit 21a and magnetically-coupled thereto an adjustable bias current circuit 21b, a portion of which may be off the chip 10. The sampling gate 21 utilizes superconducting devices, such as a Josephson tunnelling device, to perform sampling of waveforms. Such superconducting sampling gates are well known in the art, for example, as described in U.S. Pat. No. 4,401,900. A particular configuration of the sampling gate 21 is described in detail with respect to FIG. 4b. Note that the sampling gate 21 may also be connnected to other room temperature electronics including a display unit to view the DUT waveform as well as other signal processing circuitry.

The TDR system 20 also comprises a pulse generator gate 22 which is magnetically-coupled to the sampling gate 21 via a resistor 22a-Josephson junction device J1 series and provides a samplng pulse, $I_p$ to the sampling gate 21 via said coupling. The pulse generator gate 22 is also tied to a noise filter circuit 22b and a first delay circuit interface 24. A pulse generator gate which uses superconducting circuitry is also well known in the art, for example, as described in U.S. Pat. No. 4,401,900. The first delay circuit interface 24 comprises an inductor 24a which ties the pulse generator gate 22 to the remainder of the interface 24. The inductor 24a is connected to an external delay circuit, $Q_{pc}$ off the chip 10 via a low-pass resistor 24b-capacitor 24c circuit. The inductor 24a is also connected, via a resistor 24d, to a Josephson junction device J2 which triggers the pulse generator gate 22. The Josephson junction device J2 is tied to an external DC current source $I_{pp}$ off the chip 10 via a low-pass resistor 24e-capacitor 24f circuit in series with a noise filter 24g. The Josephson junction device J2 is also tied directly to a delay generator 29 to be described later.

The TDR system 20 further comprises a step generator 25 which is connected to a noise filter circuit 25a and, via a chip transmission line 25b having a resistive termination 25c and the high performance transmission lines 15, 16, is connected to the device under test (DUT). The chip transmission line 25b is magnetically-coupled to the sampling gate 21 and the pulse generator gate 22. The step generator 25 outputs a voltage step signal, $I_s$ on the chip transmission line 25b with a fast rise time, e.g., less than 10 picoseconds, which is necessary in a high performance electrical system such as a time domain reflectometer. Similar systems include logic circuit drivers and differentiating pulse generators. Several configurations for the step generator 25 utilizing Josephson junction technology are described with respect to FIGS. 3a–3e.

The step generator 25 is also magnetically-coupled to a step driver gate or buffer gate 26, via a resistor 26a-Josephson junction device J3 series. The buffer gate 26 utilizes Josephson junction technology to supply a trigger signal, $I_d$ to the step generator 25 via said magnetic coupling. The buffer gate 26 is also connected to a noise filter circuit 26b and a second delay circuit interface 28 which has the same circuit configuration as the first delay circuit interface 24. An inductor 28a ties the buffer gate 26 to the remainder of the interface 28. The inductor 28a is connected, via a low-pass resistor 28b-capacitor 28c circuit, to an external delay circuit, $Q_{dc}$ off the chip 10. Note that the connection to the external delay circuit $Q_{dc}$ is preceded by a magnetic-coupling to the delay gate of delay generator 29. The inductor 28a is also connected, via a resistor 28d, to a Josephson junction device J4 which triggers the buffer gate 26. The Josephson junction device J4 is tied to an external DC current source $I_{dd}$ off the chip 10 via a low-pass resistor 28e-capacitor 28f circuit in series with a noise filter 28g. The Josephson junction device J4 is also directly tied to the delay generator 29.

Both interfaces 24, 28 are tied to the delay generator 29 via respective input resistors 29a, 29b. The input resistors 29a, 29b are tied to a capacitor bank comprising a shunt resistor 29c-capacitor 29d series, a first low-pass resistor 29e-capacitor 29f circuit and a second low-pass resistor 29g-capacitor 29h circuit. The second low-pass circuit, in turn, is tied to a delay gate 29i. The delay gate 29i, which uses superconducting circuitry, is magnetically-coupled to an external trigger source TRIG off the chip 10, via a noise filter 29k, and is connected to the second delay circuit interface 28 as mentioned previously. The delay generator 29 is also connected to two noise filters 29m, 29n. Note that all the noise filters of the TDR system 20, as well as the other described connections to external electronics, are connected to electronics off the chip 10 via the biasing lines 13 shown in FIG. 1.

Figure 2A:
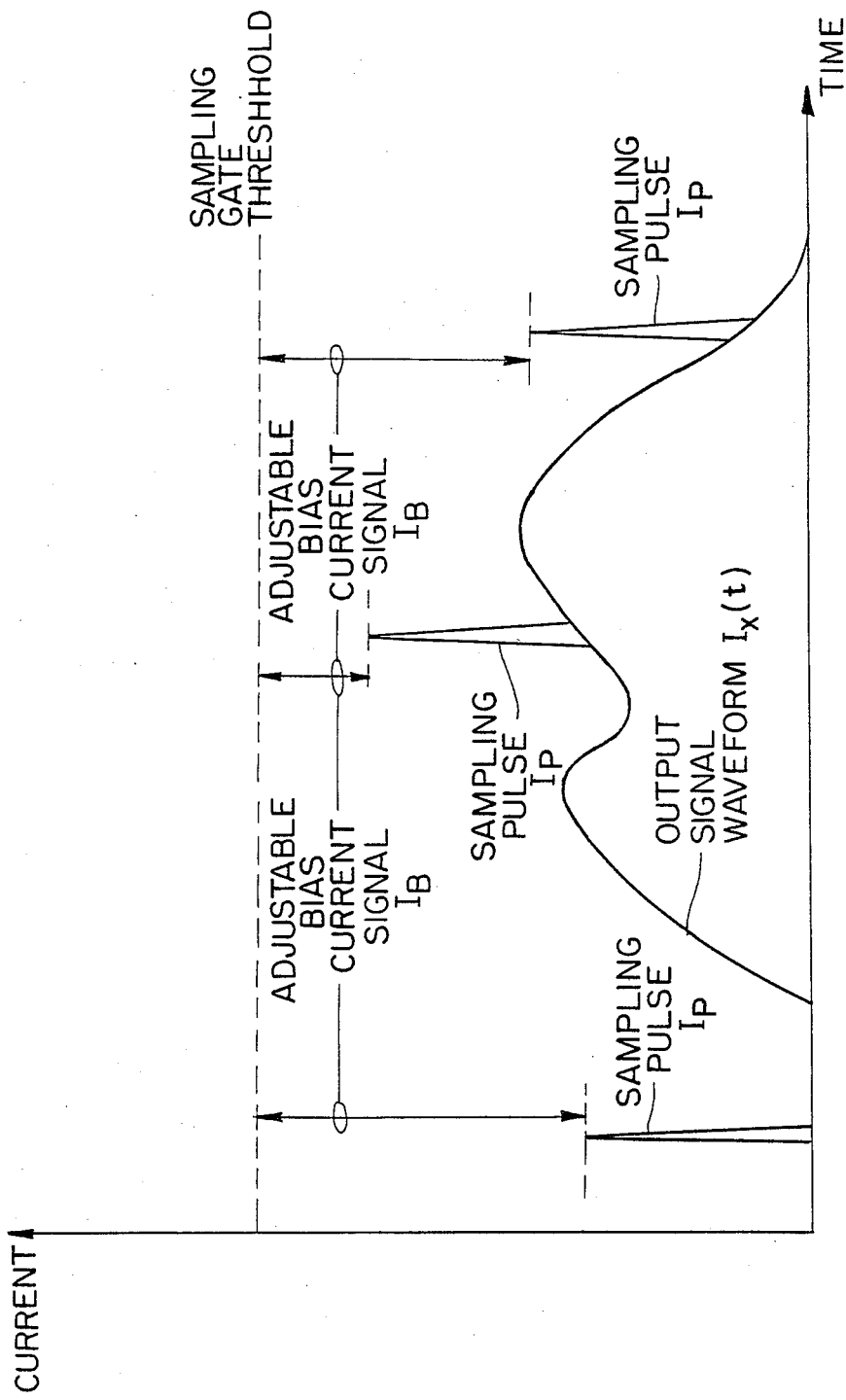
FIG. 2a is a graphical representation of the sampling operation of a sampling gate of the TDR system of FIG. 2.

In operation, the buffer gate 26 and the associated Josephson junction device J3 produce a pulse signal, $I_D$ which triggers the step generator 25 to output a step signal, $I_s$ to the device under test (DUT). In response, the DUT then operates an output signal waveform, $I_x(t)$ which is transmitted back along the chip transmission line 25b. The pulse generator gate 22 and the associated Josephson junction device J1 produce a sampling pulse, $I_p$ which is applied to the sampling gate 21 via the magnetic-couple therebetween. The sampling gate 21 is a threshhold device which will change its state when the summation of the inputs thereto exceeds a threshold value. As graphically illustrated by FIG. 2a, the sampling gate 21 thus uses the samplng pulse, $I_p$ from the pulse generator gate 23, the output signal waveform, $I_x(t)$ and a bias current signal, $I_B$ from the bias current circuit 21b in order to change its voltage state. Since the threshold value is at a constant amplitude, the value of the bias current signal, $I_B$ will track the amplitude of the output signal waveform, $I_x(t)$ if the amplitude of the sampling pulse, $I_p$ is held constant. In this manner, the output signal waveform, $I_x(t)$ can be reconstructed by the sampling gate 21 in both amplitude and shape to provide an accurate reconstruction including both rise time and fall time increments of that signal.

The generation of the step signal, $I_s$ and the introduction of the sampling pulse, $I_p$, which sweeps across the step signal and the resulting output signal, $I_x(t)$, and the timing or delay therebetween can be implemented and adjusted in one of three ways by the TDR system 20. An external delay can be produced by the trigger signal, delayed with respect to one another, delivered from circuitry off the chip 10, i.e., the external delay circuits $Q_{pc}$, $Q_{dc}$, via the first and second delay circuit interfaces 24, 28. As can be seen from FIG. 2, the external delay circuits $Q_{pc}$, $Q_{dc}$ trigger the respective Josephson junction devices, J2, J4 which in turn trigger the respective gates 22, 26. Such circuitry can change the power bias that affects the triggering of the pulse generator gate 22 and the buffer gate 26, and thus, in turn, also the step generator 25. Note that the trigger signals are ultimately derived from the TDR system 20 clock off the chip 10. On-chip delay is provided by the switching of the delay gate 29i which causes charging of the capacitor bank of the delay generator 29. The resistor-coupled capacitors are used to reduce internal resonances which could affect sweep linearity. As the capacitors charge, the currents of the trigger signals delivered from the external delay circuits $Q_{pc}$, $Q_{dc}$ and feeding to the Josephson junction devices J2, J4 of the interfaces 24, 28 change. The switching of those devices are then determined by externally supplied currents from the external DC current sources $I_{pp}$, $I_{dd}$ via the interfaces 24, 28 which compensate for the change in current and thus control the triggering of the pulse generator gate 22 and the buffer gate 26. Note that initiation of a timing cycle, i.e., the switching of the delay gate 29i, is triggered by the external trigger source TRIG whose signal is derived from the TDR system 20 clock off the chip 10. Another on-chip delay mechanism is to externally supply the same trigger signal to the pulse generator gate 22 and the buffer gate 26 but to produce the delay therebetween by adjusting the external DC current sources $I_{pp}$, $I_{dd}$ and, thus, the currents received by the first and second interfaces 24, 28. This changes the switching points of the associated Josephson junction devices J2, J4 and, thus, controls the triggering of the sampling pulse $I_p$ and the step signal, $I_s$.

Note that the use of Josephson junction devices by the TDR system 20 provides the system with an inherent ability to reduce jitter during waveform sampling because a Josephson junction device's switching threshhold value is unambiguous. Furthermore, the present invention improves on existing systems by integrating the sampling gate 21, the pulse generator 22 and the step generator 25 on a single chip and, thus, minimizes the randomness of noise between the various inputs needed for sampling. The use of external delay circuits $Q_{lpc}$, $Q_{dc}$ achieves sufficiently low jitter to provide a TDR system 20 resolution of below 15 picoseconds; however,the described on-chip delay mechanism achieve even lower jitter and provide better resolution if necessary. Such superconducting delay mechanisms of the present invention thus provide minimum jitter without being cumbersome like mechanical delay lines or limited to slowly changing waveforms like room temperature delay circuitry.

FIGS. 3a through 3e show electrical schematic diagrams of several embodiments of the step generator. FIG. 3a shows the basic configuration of a step generator 30 which comprises a configuration of triggerable devices 31 which magnetically-couple to the buffer gate 26, such as interferometers, and a network 33 which may be either purely resistive or a connected series of Josephson junction devices. A resistor 34-inductor 35 series connects the triggerable devices 31 to the network 33. The network 33 is also directly connected to the chip transmission line 36 having a resistive termination 37. FIG. 3b shows a simple implementation where the configuration of triggerable devices 31 comprises one symmetric two-Josephson junction, magnetically-coupled interferometer and the network 33 comprises a single Josephson junction device.

FIG. 3c shows the configuration of triggerable devices 31 comprising four tightly coupled interferometers of FIG. 3b and the network 33 comprising four Josephson junction devices connected in series. Such an implementation provides a step signal, $I_s$ with greater voltage amplitude and provides better stability than a configuration having a smaller number of triggerable devices. This is accomplished because the two stage balanced pseudo-interferometer structures shown in FIG. 3c tend to lock the switching points of the four Josephson junction devices and the fast rise time of the trigger pulse, $I_D$ from the buffer gate 26 ensures that the two balanced structures switch with very close time proximity. The switching of the balanced structures causes the four series-connected junctions to switch simultaneously and rapidly, via the action of the inductor 35, to produce the step signal, $I_S$. Note that with the appropriate choice of component values, the step signal, $I_S$ can have considerably lower rise time than that produced by the balanced structures only. Rise times of the step signals achieved in the manner described are in the 6 picosecond range. FIG. 3d shows the configuration of triggerable devices 31 comprising a superconducting quantum interference device (SQUID). FIG. 3e shows the configuration of triggerable devices 31 comprising two tightly coupled interferometers of FIG. 3b. Note that the number of triggerable devices in the configuration 31 does not need to be equal to the number of single Josephson junction devices in the network 33.

Figure 4A:
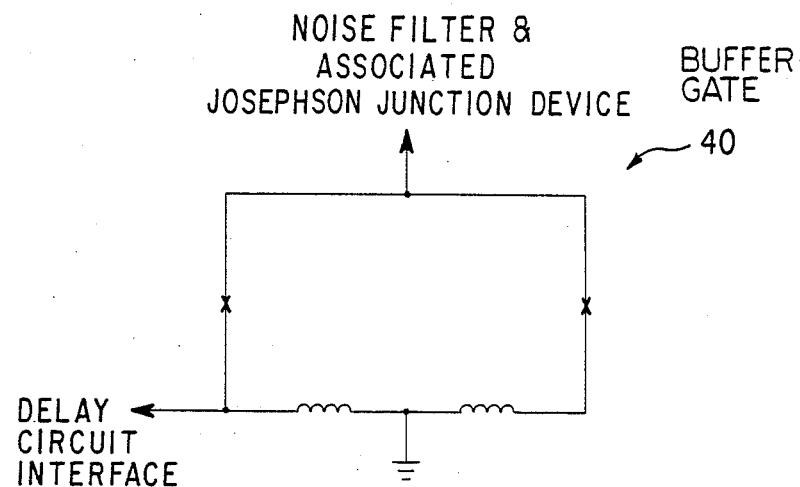
FIG. 4a is an electrical schematic diagram of a buffer gate and a pulse generator gate of the TDR system of FIG. 2.
Figure 4B:
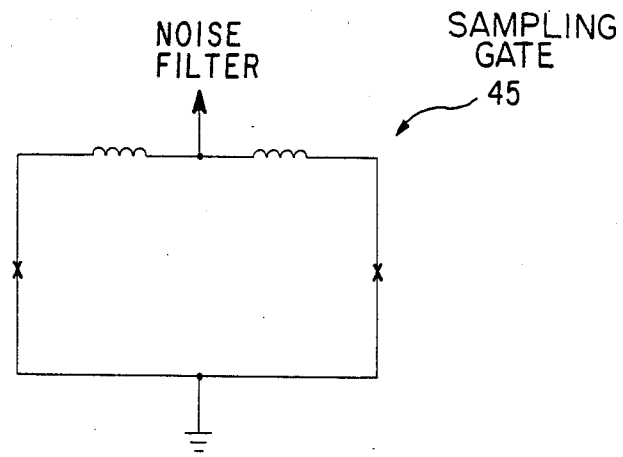
FIG. 4b is an electrical schematic diagram of a sampling gate and a delay gate of the TDR system of FIG. 2.

In order to ensure that the triggerable devices 31 of the step generator 30 switch simultaneously and in a very rapid time, e.g., shorter than 5 picoseconds, the buffer gate 26 must supply enough current to switch the devices 31 comfortably. FIG. 4a shows an electrical schematic diagram of a buffer gate 40 which can provide such a fast control. The buffer gate 40 comprises a symmetric two-Josephson junction, magnetically-coupled interferometer as previously described with respect to FIG. 3b. The pulse generator gate of the TDR system can utilize the same device and configuration since the circuit connections of both gates are similar. FIG. 4b shows the electrical schematic diagram of the sampling gate 45 and the delay gate which can utilize the same circuitry. Both gates comprise s symmetric two-Josephson junction, magnetically-coupled interferometer as described with respect to FIG. 3b but whose orientation is reversed.

Figure 4C:
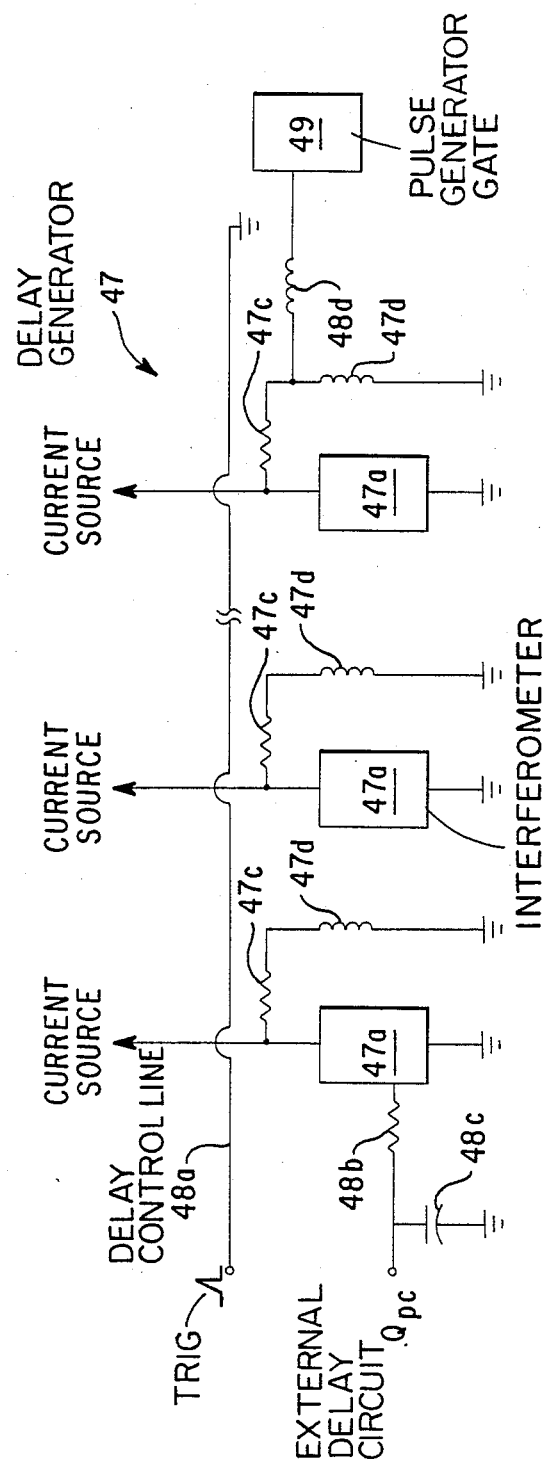
FIG. 4c is an electrical schematic diagram of an alternative embodiment of a delay generator of the TDR system of FIG. 2.

FIG. 4c shows a delay generator of the TDR system 20 which utilizes multi-stage inductive coupling rather than capacitor charging to produce a timing delay for the introduction of the sampling pulse, $I_p$ by the pulse generator gate. The delay generator 47 comprises a plurality of symmetric two-Josephson junction, magnetically-coupled interferometers 47a, as described with respect to FIG. 3b, which are magnetically coupled to one another in a series. Each interferometer 47a has an associated shunt resistor 47c inductor 47d series. The interferometers 47a are also tied to a current source, which may be off the chip 10, via noise filters (not shown). A delay control line 48a, shown running adjacent to the interferometers, is connected to, for example, a sawtooth generator off the chip 10. The trigger of the delay generator 47 can be an inductively-coupled trigger or, as shown, can be the external delay circuit, $Q_{pc}$ which is directly connected via a low-pass resistor 48b-capacitor 48c circuit. The output of the delay generator 47 can also be transmitted via magnetic-coupling, but, as shown, the output is directly tied to an inductor 48d which, in turn, is tied to a pulse generator gate 49. With respect to FIG. 2, the delay generator 47 of FIG. 4c would be placed between the low-pass resistor 24b-capacitor 24c circuit and the inductor 24a of the first delay circuit interface 24. The remainder of the interface 24 would be eliminated as would the shown delay generator 29 and the second delay circuit interface 28. In the case of the latter, the buffer gate 26 would be tied to the external pulsed DC durrent source, $I_{dd}$ via the inductor 28a. Thus, the delay generator 47 of FIG. 4c acts to only provide a delay to the sampling pulse, $I_p$ and not to the step signal, $I_s$. In operation, the delay generator 47 provides a delay when the delay control line 48a signals the interferometers 47a to change their respective switching points to thus control the triggering of the pulse generator gate 49. The total delay achieved is equal to the product of the number of interferometer stages and the delay of each stage. Note that the interferometer stages may instead by directly connected to achieve the same operation.

FIG. 5a shows a schematic representation of a top view and two vertical profiles of a step generator of the present invention as fabricated on the substrate 11 of a chip 10. The top view of the step generator shows four Josephson junction devices of the step generator formed on the substrate 11. A first vertical profile A shows the cross-section of the Josephson junction devices along line A—A. The profile A comprises a three layer base M1 having a thin layer of aluminum oxide ($Al_2O_3$) sandwiched between two layers of niobium (Nb). The base M1 is patterned and anodized using niobium oxide ($Nb_2O_5$) so as to leave exposed the areas upon which the Josephson junction devices are formed. A first interconnection lever M2 comprises niobium (Nb) is the next layer, such that the M1-M2 interfaces have the Josephson junction devices therebetween. On the first interconnection level M2 is a resistor layer (not shown) and an insulating layer of silicon dioxide ($SiO_2$). A second interconnection level M3 is also comprised a niobium (Nb) which has a gold (Au) contact layer formed thereon as shown. A second vertical profile B shows the cross-section of the step generator along line B—B. FIG. 5b shows a schematic representation of a top view and a vertical profile of a pulse generator gate and a buffer gate of the present invention which are both fabricated on the substrate 112 of a chip 10 in the same manner. The top view of the gate shows two Josephson junction devices of the gate formed on the substrate 11. A vertical profile C shows the cross-section of the Josephson junction devices along line C—C and, although of a different configuration, is the same layered structure as described above for the step generator.

FIG. 6a shows an electrical schematic diagram of a TDR system 60 of the present invention which utilizes direct coupling between a sampling gate 61 and the various input signal sources. The sampling gate 61 has a circuit configuration as shown in FIG. 4a and is tied to the device under test (DUT) via a first chip transmission line 62 which has a resistive termination 63 therebetween. The sampling gate 61 is also connected directly to an associated noise filter circuit 61b and a bias current circuit 61c. A pulse generator 64 is connected directly to the sampling gate 61 via a resistor 64a-Josephson junction device J1 series. A step generator 65 is connected directly to the DUT via a second chip transmission line 66 having a resistive termination 67. The two chip transmission lines 62, 66 are tied together to form one path to the DUT. Unlike the TDR system 20 of FIG. 2, the TDR system 60 of FIG. 6a splits the current of the step signal, $I_s$ sent out by step generator 65 as well as the current of the output signal, $I_x(t)$ of the DUT in order to measure and sample the output signal waveform. A disadvantage of the "direct-coupled" TDR system of FIG. 6a is the super-imposing effect on the transmission lines caused by the current splitting of the step and output signals. However, the operation of the TDR system 60 remains the same as previously described and sampling of an extremely fast waveform is still possible. FIGS. 6b and 6c show other configurations of direct-coupled TDR systems where the step generator 65 is tied to the sampling gate 61 in different but operable manners. In these configurations, the step generator 65 comprises a configuration of triggerable devices 65a with a network 65b shunted across. However, unlike the embodiments shown in FIGS. 3a-3c, there is no need for resistor and inductor components on the interconnection line therebetween or on the chip transmission line. Further, the network 65b is optional. If used, the network 65b may be, for example, a resistive network for matching the dynamics of the configuration of triggerable devices 65a. The same limitations of FIG. 6a regarding performance also hold true.

It is to be understood that the embodiments described herein are merely illustrative of the principles of the invention. Various modifications may be made thereto by persons skilled in the art without departing from the scope or spirit of the invention.

What is claimed is:

1. A system for high resolution sampling of the waveform of an output signal generated by a signal source, comprising:
   a. means for generating and transmitting a trigger signal to the signal source to initiate a transmission of the output signal to the sampling system;
   b. means for generating and introducing sampling pulses with the transmission of the output signal to the sampling system;
   c. means for sampling the output signal comprising an adjustable bias signal source and a superconducting sampling gate having at least two distinguishable states to which the output signal, said sampling pulses and a bias signal provided by said adjustable bias signal source is applied for switching the state of said gate in sampling the output signal;
   d. at least one superconducting switch, having at least two distinguishable states, that triggers the means for generating and transmitting a trigger signal to initiate a trigger signal transmission and the means for generating and introducing sampling pulses to initiate a sampling pulse transmission; and
   e. means for changing the switching point of the at least one superconducting switch so that the triggering of the trigger signal and sampling pulse transmissions can be adjustably delayed with respect to one another.

2. The device of claim 1, wherein the means for changing the switching point comprises:
   means for changing a power bias applied to the at least one superconducting switch so that the switching point of the at least one switch is adjustable and the triggering of the trigger signal and sampling pulse transmission can be adjustably delayed with respect to one another.

3. The device of claim 1, wherein the means for changing the switching point comprises:
   means for changing a current feeding the at least one superconducting switch so that the switching point of the at least one switch is adjustable and the triggering of the trigger signal and sampling pulse transmissions can be adjustably delayed with respect to one another.

4. The device of claim 1, wherein the means for changing the switching point comprises:
   a delay generator comprising a switchable delay gate and a capacitor bank that charges in response to the switching of the delay gate, the charging of the capacitor bank changing the current feeding the at least one superconducting switch so that the switching point of the at least one switch is adjustable and the triggering of the trigger signal and sampling pulse transmissions can be adjustably delayed with respect to one another.

5. A system for high resolution sampling of the waveform of an output signal generated by a signal source, comprising:
   a. means for generating and transmitting a trigger signal to the signal source to initiate a transmission of the output signal to the sampling system;
   b. means for generating and introducing sampling pulses with the transmission of the output signal to the sampling system;
   c. means for sampling the output signal comprising an adjustable bias signal source and a superconducting sampling gate having at least two distinguishable states to which the output signal, said sampling pulses and a bias signal provided by said adjustable bias signal source is applied for switching the state of said gate in sampling the output signal;
   d. at least one superconducting device displaying a Josephson tunnelling current, having at least two distinguishable states, that triggers the means for generating and transmitting a trigger signal to initiate a trigger signal transmission and the means for generating and introducing sampling pulses to initiate a sampling pulse transmission; and
   e. means for changing the switching point of the at least one superconducting device displaying a Josephson tunnelling current so that the triggering of the trigger signal and sampling pulse transmissions can be adjustably delayed with respect to one another.

6. The device of claim 5, wherein the means for changing the switching point comprises:
   means for changing a power bias applied to the at least one superconducting device displaying a Josephson tunnelling current so that the switching point of the at least one device is adjustable and the triggering of the trigger signal and sampling pulse transmissions can be adjustably delayed with respect to one another.

7. The device of claim 5, wherein the means for changing the switching point comprises:
   means for changing a current feeding the at least one superconducting device displaying a Josephson tunnelling current so that the switching point of the at least one device is adjustable and the triggering of the trigger signal and sampling pulse transmissions can be adjustably delayed with respect to one another.

8. The device of claim 5, wherein the means of changing the switching point comprises:
   a delay generator comprising a switchable delay gate and a capacitor bank that charges in response to the switching of the delay gate, the charging of the capacitor bank changing the current feeding the at least one superconducting device displaying a Josephson tunnelling current so that the switching point of the at least one device is adjustable and the triggering of the trigger signal and sampling pulse transmissions can be adjustably delayed with respect to one another.

9. A system for high resolution sampling of the waveform of an output signal generated by a signal source, comprising:
   a. means for generating and transmitting a trigger signal to the signal source to initiate a transmission of the output signal to the sampling system;
   b. means for generating and introducing sampling pulses with the transmission of the output signal to the sampling system;
   c. means for sampling the output signal comprising an adjustable bias signal source and a superconducting sampling gate having at least two distinguishable states to which the output signal, said sampling pulses and a bias signal provided by said adjustable bias signal source is applied by switching the state of said gate in sampling the output signal;
   d. at least one superconducting device, comprising a Josephson junction and first and second electrodes on either side of the junction and having at least two distinguishable states, that triggers the means for generating and transmitting a trigger signal to initiate a trigger signal transmission and the means for generating and introducing sampling pulses to initiate a sampling pulse transmission; and
   e. means for changing the switching point of the at least one superconducting device so that the triggering of the trigger signal and sampling pulse transmissions can be adjustably delayed with respect to one another.

10. The device of claim 9, wherein the means for changing the switching point comprises:
   means for changing a power bias applied to the at least one superconducting device so that switching point of the at least one device is adjustable and the triggering of the trigger signal and sampling pulse transmissions can be adjustably delayed with respect to one another.

11. The device of claim 9, wherein the means for changing the switching point comprises:
   means for changing a current feeding the at least one superconducting device so that the switching point of the at least one device is adjustable and the triggering of the trigger signal and sampling pulse transmissions can be adjustably delayed with respect to one another.

12. The device of claim 9, wherein the means for changing the switching point comprises:
   a delay generator comprising a switchable delay gate and a capacitor bank that charges in response to the switching of the delay gate, the charging of the capacitor bank changing the current feeding the at least one superconducting device so that the switching point of the at least one device is adjustable and the triggering of the trigger signal and sampling pulse transmissions can be adjustably delayed with respect to one another.

13. A system for high resolution sampling of the waveform of an output signal generated by a signal source, comprising:
   a. a first superconducting switch, having at least two distinguishable states, that is capable of being triggered into switching action by a control signal;
   b. means for providing a control signal to the first superconducting switch to trigger the switch into switching action, said switching action generating a trigger signal that is transmitted to the signal source to initiate a transmission of the output waveform to the sampling system;
   c. means for generating and introducing sampling pulses with the transmission of the output signal to the sampling system;
   d. means for sampling the output signal comprising an adjustable bias signal soruce and a superconducting sampling gate having at least two distinguishable states to which the output signal, said sampling pulses and a bias signal provided by said adjustable bias signal source is applied for switching the state of said gate in sampling the output signal;
   e. a second superconducting switch, having at least two distinguishable states, that triggers the means for providing a control signal to the first superconducting switch to initiate a trigger signal transmission and the means for generating and introducing sampling pulses to initiate a sampling pulse transmission; and
   f. means for changing the switching point of the second superconducting switch so that the triggering of the trigger signal and sampling pulse transmissions can be adjustably delayed with respect to one another.

14. The device of claim 13, wherein the means for providing a control signal comprises:
   a third superconducting switch, having at least two distinguishable states, that provides a control signal to the first superconducting switch to trigger the first switch into switching action, said switching action generating a trigger signal that is transmitted to the signal source to initiate a transmission of the output waveform to the sampling system.

15. The device of claim 13, wherein the means for providing a control signal comprises:
   at least one superconducting device displaying a Josephson tunnelling current, having at least two distinguishable states, that provides a control signal to the first superconducting switch to trigger the switch into switching action, said switching action generating a trigger signal that is transmitted to the signal source to initiate a transmission of the output waveform to the sampling system.

16. The device of claim 13, wherein the means for providing a control signal comprises:
   at least one superconducting device, comprising a Josephson junction and first and second electrodes on either side of the junction and having at least two distinguishable states, that provides a control signal to the first superconducting switch to trigger the switch into switching action, said switching action generating a trigger signal that is transmitted to the signal source to initiate a transmission of the output waveform to the sampling system.

17. The device of claim 13, wherein the means for providing a control signal comprises:
   at least one symmetric, two-Josephson junction interferometer which is magnetically coupled to the first superconducting switch and which provides a control signal to the first superconducting switch to trigger the switch into switching action, said switching action generating a trigger signal that is transmitted to the signal source to initiate a transmission of the output waveform to the sampling system.

18. A system for high resolution sampling of the waveform of an output signal generated by a signal source, comprising:
   a. at least one superconducting device displaying a Josephson tunnelling current, having at least two distinguishable states, that is capable of being triggered into switching action by a control signal;

b. means for providing a control signal to the at least one superconducting device displaying a Josephson tunnelling current to trigger the device into switching action, said switching action generating a trigger signal that is transmitted to the signal source to initiate a transmission of the output waveform to the sampling system;

c. means for generating and introducing sampling pulses with the transmission of the output signal to the sampling system;

d. means for sampling the output signal comprising an adjustable bias signal source and a superconducting sampling gate having at least two distinguishable states to which the output signal, said sampling pulses and a bias signal provided by said adjustable bias signal source is applied for switching the state of said gate in sampling the output signal;

e. at least one superconducting switch, having at least two distinguishable states, that triggers the means for providing a control signal to the at least one superconducting device to initiate a trigger signal transmission and the means for generating and introducing sampling pulses to initiate a sampling pulse transmission; and f. means for changing the switching point of the at least one superconducting switch so that the triggering of the trigger signal and sampling pulse transmissions can be adjustably delayed with respect to one another.

19. A system for high resolution sampling of the waveform of an output signal generated by a signal source, comprising:

a. at least one superconducting device, comprising a Josephson junction and first and second electrodes on either side of the junction and having at least two distinguishable states, that is capable of being triggered into switching action by a control signal;

b. means for providing a control signal to the at least one superconducting device to trigger the device into switching action, said switching action generating a trigger signal that is transmitted to the signal source to initiate a transmission of the output waveform to the sampling system.

c. means for generating and introducing sampling pulses with the transmission of the output signal to the sampling system;

d. means for sampling the output signal comprising an adjustable bias signal source and a superconducting sampling gate having at least two distinguishable states to which the output signal, said sampling pulses and a bias signal provided by said adjustable bias signal source is applied for switching the state of said gate in sampling the output signal;

e. at least one superconducting switch, having at least two distinguishable states, that triggers the means for providing a control signal to the at least one superconducting device to initiate a trigger signal transmission and the means for generating and introducing sampling pulses to initiate a sampling pulse transmission; and f. means for changing the switching point of the at least one superconducting switch so that the triggering of the trigger signal and sampling pulse transmissions can be adjustably delayed with respect to one another.

20. A system for high resolution sampling of the waveform of an output signal generated by a signal source, comprising:

a. means for transmitting signals between the sampling system and the signal source;

b. a plurality of superconducting switches, each having at least two distinguishable states, connected in combination to the means for transmitting;

c. a resistive network connected to the means for transmitting in parallel to the plurality of superconducting switches;

d. means for providing a control signal to the plurality of superconducting switches to trigger the switches into switching action, said switching action generating a trigger signal that is transmitted to the signal source, via the means for transmitting, to initiate a transmission of the output waveform to the sampling system;

e. means for generating and introducing sampling pulses with the transmission of the output signal to the sampling system;

f. means for sampling the output signal comprising an adjustable bias signal source and a superconducting sampling gate having at least two distinguishable states to which the output signal, said sampling pulses and a bias signal provided by said adjustable bias signal source is applied for switching the state of said gate in sampling the output signal;

g. at least one superconducting switch, having at least two distinguishable states, that triggers the means for providing a control signal to the plurality of superconducting switches to initiate a trigger signal transmission and the means for generating and introducing sampling pulses to initiate a sampling pulse transmission; and h. means for changing the switching point of the at least one superconducting switch so that the triggering of the trigger signal and sampling pulse transmissions can be adjustably delayed with respect to one another.

21. A system for high resolution sampling of the waveform of an output signal generated by a signal source, comprising:

a. means for transmitting signals between the sampling system and the signal source;

b. a plurality of superconducting switches, each having at least two distinguishable states, connected in combination to the means for transmitting;

c. at least one superconducting switch, having at least two distinguishable states, connected to the means for transmitting in parallel to the plurality of superconducting switches;

d. means for providing a control signal to the plurality of superconducting switches to trigger the switches into switching action, said switching action generating a trigger signal that is transmitted to the signal source, via the means for transmitting, to initiate a transmission of the output waveform to the sampling system;

e. means for generating and introducing sampling pulses with the transmission of the output signal to the sampling system;

f. means for sampling the output signal comprising an adjustable bias signal source and a superconducting sampling gate having at least two distinguishable states to which the output signal, said sampling pulses and a bias signal provided by said adjustable bias signal source is applied for switching the state of said gate in sampling the output signal;

g. a second superconducting switch, having at least two distinguishable states, that triggers the means for providing a control signal to the plurality of superconducting switches to initiate a trigger signal transmission and the means for generating and introducing sampling pulses to initiate a sampling pulse transmission; and h. means for changing the switching point of the second superconducting switch so that the triggering of the trigger signal and sampling pulse transmissions can be adjustably delayed with respect to one another.

22. The device of claim 21, wherein the plurality of superconducting switches comprises:
at least one symmetric, two-Josephson junction interferometer connected to the means for transmitting.

23. The device of claim 21, wherein the plurality of superconducting switches comprises:
a superconducting quantum interference device connected to the means for transmitting.

24. The device of claim 21, wherein the plurality of superconducting switches comprises:
a first symmetric, two-Josephson junction interferometer connected to the means for transmitting; and
the means for providing a control signal comprises:
a second symmetric, two-Josephson junction interferometer, which is magnetically-coupled to the first interferometer and which provides a control signal to the first interferometer to trigger the first interferometer into switching action, said switching action generating a trigger signal that is transmitted to the signal source, via the means for transmitting, to initiate a transmission of the output waveform to the sampling system.

25. A system for high resolution sampling of the waveform of an output signal generated by a signal source, comprising:
a. means for generating and transmitting a trigger signal to the signal source to initiate a transmission of the output signal to the sampling system;
b. means for generating and introducing sampling pulses with the transmission of the output signal to the sampling system;
c. means for sampling the output signal comprising an adjustable bias signal source and a superconducting sampling gate having at least two distinguishable states to which the output signal, said sampling pulses and a bias signal provided by said adjustable bias signal source is applied for switching the state of said gate in sampling the output signal;
d. means for actuating the means for generating and transmitting a trigger signal to initiate a trigger signal transmission in a specified pulsed fashion; and
e. at least one superconducting switch, having at least two distinguishable states, that actuates the means for generating and introducing sampling pulses to initiate a sampling pulse transmission a specified time after each trigger signal transmission.

26. The device of claim 25, wherein the at least one superconducting switch comprises:
at least one superconducting device displaying a Josephson tunnelling current.

27. The device of claim 25, wherein the at least one superconducting switch comprises:
at least one superconducting device, comprising a Josephson junction and first and second electrodes on either side of the junction.

28. The device of claim 25, wherein the at least one superconducting switch comprises:
a delay generator comprising a plurality of symmetric, two-Josephson junction interferometers, which are magnetically-coupled to one another in a series, and means for controlling the respective switching points of the plurality of interferometers, the output of said delay generator actuating the means for generating and introducing sampling pulses to initiate a sampling pulse transmission a specified time period after each trigger signal transmission.

29. A system for high resolution sampling of the waveform of an output signal generated by a signal source, comprising:
a. a first superconducting device displaying a Josephson tunnelling current, having at least two distinguishable states, which generates and transmits a trigger signal upon switching states to the signal source to initiate a transmission of the output signal to the sampling system;
b. a second superconducting device displaying a Josephson tunnelling current, having at least two distinguishable states, which provides a control signal to the first superconducting device to cause the first superconducting device to switch states and thereby generate and transmit a trigger signal;
c. means for generating and introducing sampling pulses with the transmission of the output signal to the sampling system;
d. means for sampling the output signal comprising an adjustable bias source and a superconducting sampling gate having at least two distinguishable states to which the output signal, said sampling pulses and a bias signal provided by said adjustable bias signal source is applied for switching the state of said gate in sampling the output signal;
e. a third superconducting device displaying a Josephson tunnelling current, having at least two distinguishable states, which triggers the second superconducting device to provide a control signal to the first superconducting device to initiate a trigger signal transmission and which triggers the means for generating and introducing sampling pulses to initiate a sampling pulse transmission; and
f. means for changing the switching point of the third superconducting switch so that the triggering of the trigger signal and sampling pulse transmissions can be adjustably delayed with respect to one another.

30. A system for high resolution sampling of the waveform of an output signal generated by a signal source, comprising:
a. means for transmitting signals between the sampling system and the signal source;
b. a first superconducting device displaying a Josephson tunnelling current, having at least two distinguishable states, which generates and transmits a trigger signal upon switching states to the signal source via the means for transmitting to initiate a transmission of the output signal to the sampling system;
c. a second superconducting device displaying a Josephson tunnelling current, having at least two distinguishable states, which provides a control signal to the first superconducting device, via a magnetic-coupling therebetween, to cause the first superconducting device to switch states and thereby generate and transmit a trigger signal;

d. a pulse generator which introduces sampling pulses, via a magnetic-coupling to the means for transmitting, with the transmission of the output signal to the sampling system;

e. means for sampling the output signal comprising an adjustable bias source and a superconducting sampling gate having at least two distinguishable states to which the output signal, said sampling pulses, and a bias signal provided by said adjustable bias signal source is applied for switching the state of said gate in sampling the output signal, said gate receiving the output signal from the means for transmitting and the sampling pulses from the pulse generator from respective magnetic-couples therebetween;

f. a third superconducting device displaying a Josephson tunnelling current, having at least two distinguishable states, which triggers the second superconducting device to provide a control signal to the first superconducting device to initiate a trigger signal transmission and which triggers the pulse generator to initiate a sampling pulse transmission; and g. means for changing the switching point of the third superconducting device so that the triggering of the trigger signal and the sampling pulse transmissions can be adjustably delayed with respect to one another.

31. A system for high resolution sampling of the waveform of an output signal generated by a signal source, comprising:

a. means for transmitting signals between the sampling system and the signal source;

b. a first superconducting device displaying a Josephson tunnelling current, having at least two distinguishable states, which is directly connected to a first point of the means for transmitting and which generates and transmits a trigger signal upon switching states to the signal source to initiate a transmission of the output signal to the sampling system;

c. a second superconducting device displaying a Josephson tunnelling current, having at least two distinguishable states, which provides a control signal to the first superconducting device, via a magnetic-coupling therebetween, to cause the first superconducting device to switch states and thereby generate and transmit a trigger signal;

d. a pulse generator which introduces sampling pulses, via a direct connection to the first point of the means for transmitting, with the transmission of the output signal to the sampling system;

e. means for sampling the output signal comprising an adjustable bias source and a superconducting sampling gate having at least two distinguishable states to which the output signal, said sampling pulses, and a bias signal provided by said adjustable bias signal source is applied for switching the state of said gate in sampling the output signal, said gate receiving the output signal and the sampling pulses from the pulse generator from a direct connection to the first point of the means for transmitting;

f. a third superconducting device displaying a Josephson tunnelling current, having at least two distinguishable states, which triggers the second superconducting device to provide a control signal to the first superconducting device to initiate a trigger signal transmission and which triggers the pulse generator to initiate a sampling pulse transmission; and g. means for changing the switching point of the third superconducting device so that the triggering of the trigger signal and the sampling pulse transmissions can be adjustably delayed with respect to one another.

32. A system for high resolution sampling of the waveform of an output signal generated by a signal source, comprising:

a. means for transmitting signals between the sampling system and the signal source;

b. a first superconducting device displaying a Josephson tunnelling current, having at least two distinguishable states, comprising a plurality of superconducting switches directly connected in combination to a first point of the means for transmitting and a resistive network connected in parallel to the combination, said device generating and transmitting a trigger signal upon switching states to the signal source to initiate a transmission of the output signal to the sampling system;

c. a second superconducting device displaying a Josephson tunnelling current, having at least two distinguishable states, which provides a control signal to the first superconducting device, via a magnetic-coupling therebetween, to cause the first superconducting device to switch states and thereby generate and transmit a trigger signal;

d. a pulse generator which introduces sampling pulses, via a direct connection to the first point of the means for transmitting, with the transmission of the output signal to the sampling system;

e. means for sampling the output signal comprising an adjustable bias source and a superconducting sampling gate having at least two distinguishable states to which the output signal, said sampling pulses, and a bias signal provided by the adjustable bias signal source is applied for switching the state of said gate in sampling the output signal, said gate receiving the output signal and the sampling pulses from the pulse generator from a direct series connection with the resistive network of the first superconducting device;

f. a third superconducting device displaying a Josephson tunnelling current, having at least two distinguishable states, which triggers the second superconducting device to provide a control signal to the first superconducting device to initiate a trigger signal transmission and which triggers the pulse generator to initiate a sampling pulse transmission; and g. means for changing the switching point of the third superconducting device so that the triggering of the trigger signal and the sampling pulse transmissions can be adjustably delayed with respect to one another.

33. A system for high resolution sampling of the waveform of an output signal generated by a signal source, comprising:

a. means for transmitting signals between the sampling system and the signal source;

b. a first superconducting device displaying a Josephson tunnelling current, having at least two distinguishable states, comprising a plurality of superconducting switches directly connected in combination to a first point of the means for transmitting and a resistive network connected in parallel to the combination, said device generating and transmitting a trigger signal upon switching states to the signal source to initiate a transmission of the output signal to the sampling system;

c. a second superconducting device displaying a Josephson tunnelling current, having at least two distinguishable states, which provides a control signal to the first superconducting device, via a magnetic-coupling therebetween, to cause the first superconducting device to switch states and thereby generate and transmit a trigger signal;

d. a pulse generator which introduces sampling pulses, via a direct connection to the first point of the means for transmitting, with the transmission of the output signal to the sampling system;

e. means for sampling the output signal comprising an adjustable bias source and a superconducting sampling gate having at least two distinguishable states to which the output signal, said sampling pulses, and a bias signal provided by the adjustable bias signal source is applied for switching the state of said gate in sampling the output signal, said gate receiving the output signal and the sampling pulses from the pulse generator from a direct series connection with the combination of plurality of superconducting switches of the first superconducting device;

f. a third supeconducting device displaying a Josephson tunnelling current, having at least two distinguishable states, which triggers the second superconducting device to provide a control signal to the first superconducting device to initiate a trigger signal transmission and which triggers the pulse generator to initiate a sampling pulse transmission; and g. means for changing the switching point of the thrid superconducting device so that the triggering of the trigger signal and the sampling pulse transmissions can be adjustably delayed with respect to one another.

34. A method for high resolution sampling of the waveform of an output signal generated by a signal source, comprising:

a. generating and transmitting a trigger signal from a first superconducting device displaying a Josephson tunnelling current, having at least two distinguishable states, to the signal source to initiate a transmission of the output signal to the sampling system;

b. providing a control signal from a second superconducting device displaying a Josephson tunnelling current, having at least two distinguishable states, to the first superconducting device to cause the first superconducting device to switch states and thereby generate and transmit a trigger signal;

c. generating and introducing sampling pulses with the transmission of the output signal to the sampling system;

d. sampling the output signal by applying the output signal, said sampling pulses and a bias signal provided by an adjustable bias signal source to a superconducting sampling gate having at least two distinguishable states for switching the state of said gate in sampling the output signal;

e. triggering the second superconducting device, via a third superconducting device displaying a Josephson tunnelling current, having at least two distinguishable states, to provide a control signal to the first superconducting device to initiate a trigger signal transmission and triggering the means for generating and introducing sampling pulses to initiate a sampling pulse transmission; and f. changing the switching point of the third superconducting switch so that the triggering of the trigger signal and sampling pulse transmissions can be adjustably delayed with respect to one another.

35. A system for high resolution sampling of the electrical waveform of a signal transmitted from a signal source, comprising:

a. a substrate having a first portion capable of being cooled to a cryogenic temperature while simultaneously having a second portion at a second temperature;

b. means for measuring and storing the instantaneous value of the waveform of a signal transmitted from a signal source, said means for measuring and storing being formed on the first portion of the substrate;

c. means for transmitting signals between the means for measuring and storing and the signal source;

d. means for applying an incident signal to the signal source to initiate a transmission of a signal to the means for measuring and storing, said means for applying being formed on the first portion of the substrate;

e. means for adjustably delaying the application of an incident signal by the means for applying with respect to the measuring and storing the instantaneous value of the signal waveform by the means for measuring and storing.

* * * * *

UNITED STATES PATENT AND TRADEMARK OFFICE
CERTIFICATE OF CORRECTION

PATENT NO. : 4,789,794

DATED : December 6, 1988

INVENTOR(S) : WHITELEY et al.

It is certified that error appears in the above-identified patent and that said Letters Patent is hereby corrected as shown below:

Column 1, line 8, "inventino" should read --invention--.

Column 3, line 50, "Nos." should read --No.--.

Column 5, line 30, "operates" should read --outputs--.

Column 5, line 56, "signal," should read --signals,--.

Column 6, line 35, "Q/pc," should read --Qpc,--.

Column 7, line 36, "comprise s symmetric" should read --comprise a symmetric--.

Column 8, line 11, "by" should read --be--.

Column 8, line 26, "lever" should read --level--.

UNITED STATES PATENT AND TRADEMARK OFFICE
CERTIFICATE OF CORRECTION

PATENT NO. : 4,789,794

DATED : December 6, 1988

INVENTOR(S) : WHITELEY et al.

It is certified that error appears in the above-identified patent and that said Letters Patent is hereby corrected as shown below:

Column 8, line 26, "comprises" should read --comprising--.

Column 8, line 31, "a" should read --of--.

Column 8, line 38, "112" should read --11--.

Column 12, line 5, "soruce" should read --source--.

Signed and Sealed this

Sixteenth Day of January, 1990

*Attest:*

JEFFREY M. SAMUELS

*Attesting Officer*  *Acting Commissioner of Patents and Trademarks*